United States Patent
Park et al.

(10) Patent No.: US 10,658,112 B2
(45) Date of Patent: May 19, 2020

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: Samsung Electro-Mechanics Co., Ltd., Suwonsi, Gyeonggi-do (KR)

(*) Notice: Subject to any disclaimer, the term of this patent is extended or adjusted under 35 U.S.C. 154(b) by 0 days.

(21) Appl. No.: 16/184,568

(22) Filed: Nov. 8, 2018

(65) Prior Publication Data
US 2019/0326056 A1    Oct. 24, 2019

(30) Foreign Application Priority Data
Apr. 24, 2018 (KR) .................. 10-2018-0047448

(51) Int. Cl.
*H01G 4/30* (2006.01)
*H01G 4/012* (2006.01)
*H01G 4/232* (2006.01)
*H01G 4/35* (2006.01)
*H01G 4/224* (2006.01)
*H05K 1/18* (2006.01)
(Continued)

(52) U.S. Cl.
CPC ............ *H01G 4/012* (2013.01); *H01G 4/224* (2013.01); *H01G 4/2325* (2013.01); *H01G 4/30* (2013.01); *H01G 4/35* (2013.01); *H05K 1/0231* (2013.01); *H05K 1/181* (2013.01); *H01G 4/1227* (2013.01); *H05K 2201/10015* (2013.01); *H05K 2201/10636* (2013.01)

(58) Field of Classification Search
CPC .......... H01G 4/005; H01G 4/08; H01G 4/012; H01G 4/12; H01G 4/30; H01G 4/232; H01G 4/248
See application file for complete search history.

(56) References Cited

U.S. PATENT DOCUMENTS

| | | | |
|---|---|---|---|
| 9,336,950 B2 * | 5/2016 | Kim ................... | H01G 4/012 |
| 9,633,790 B1 * | 4/2017 | Kim ................... | H01G 4/30 |
| 2008/0049377 A1 | 2/2008 | Sutardja | |

(Continued)

FOREIGN PATENT DOCUMENTS

| | | |
|---|---|---|
| JP | 2009-054973 A | 3/2009 |
| JP | 4864271 B2 | 2/2012 |

*Primary Examiner* — Nguyen T Ha
(74) *Attorney, Agent, or Firm* — Morgan, Lewis & Bockius LLP

(57) ABSTRACT

A multilayer capacitor includes a capacitor body including first and second internal electrodes disposed alternately in a width direction; first and second external electrodes spaced apart from each other on a mounting surface; and a first insulating layer disposed between the first and second external electrodes, in which the first and second internal electrodes each include a body portion, a first lead portion extending from the body portion toward the mounting surface and electrically connected to the first and second external electrodes, and a second lead portion extending from the body portion toward a surface of the capacitor body opposing the mounting surface, and the first and second lead portions extend from each body portion in a diagonal direction relative to each other.

17 Claims, 10 Drawing Sheets

(51) Int. Cl.
*H05K 1/02* (2006.01)
*H01G 4/12* (2006.01)

(56) References Cited

U.S. PATENT DOCUMENTS

| | | | |
|---|---|---|---|
| 2013/0314843 A1* | 11/2013 | Chung | H01L 41/0472 361/306.3 |
| 2014/0160619 A1* | 6/2014 | Kim | H01G 4/30 361/301.4 |
| 2015/0014040 A1* | 1/2015 | Ahn | H01G 4/30 174/260 |
| 2017/0367188 A1* | 12/2017 | Park | H01G 4/012 |

* cited by examiner

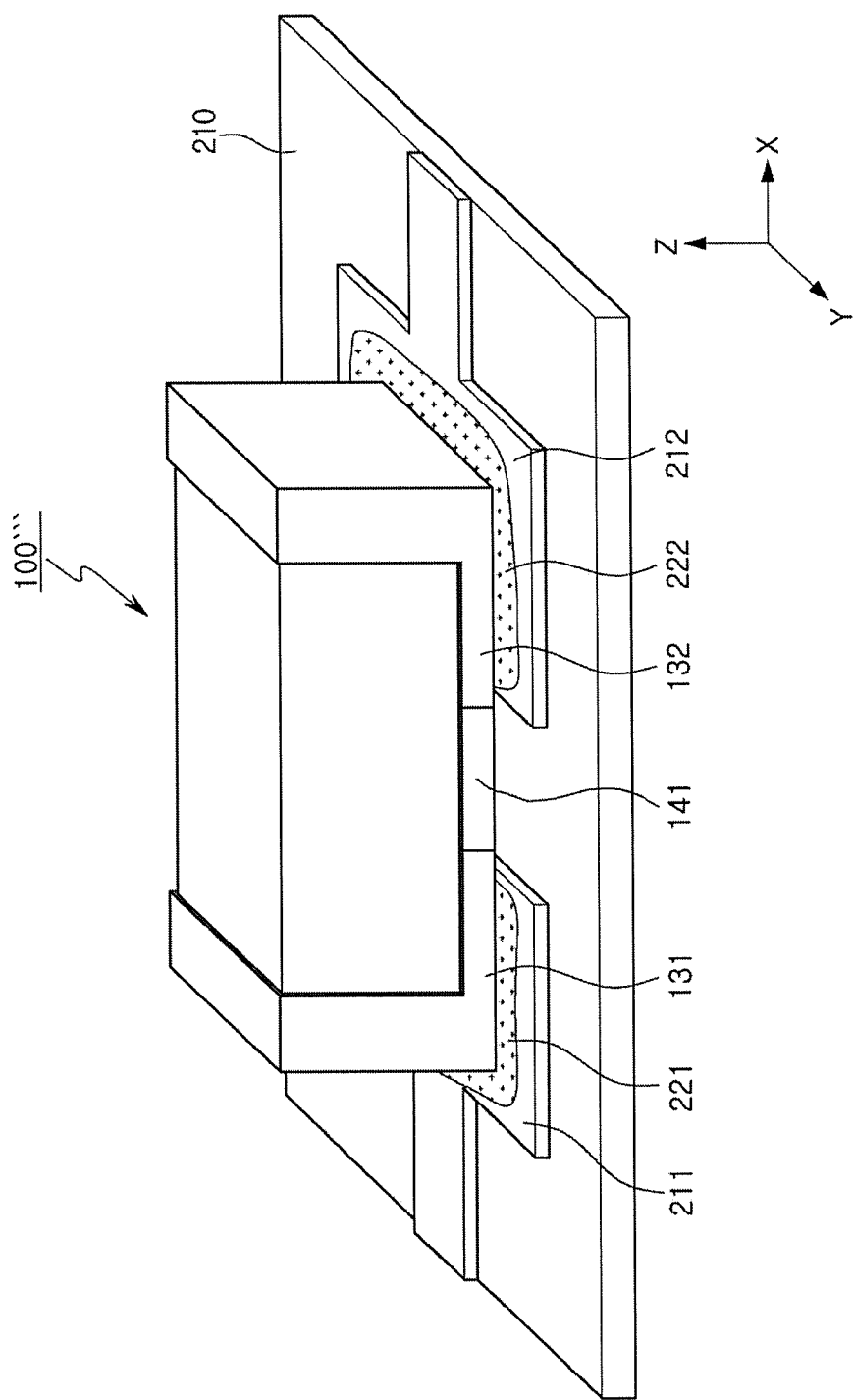

MULTILAYER CAPACITOR AND BOARD HAVING THE SAME

CROSS-REFERENCE TO RELATED APPLICATION(S)

This application claims the benefit of priority to Korean Patent Application No. 10-2018-0047448 filed on Apr. 24, 2018 in the Korean Intellectual Property Office, the disclosure of which is incorporated herein by reference in its entirety.

TECHNICAL FIELD

The present disclosure relates to a multilayer capacitor and a board having the same.

BACKGROUND

The high performance Large Scale Integration (LSI) system that represents the application processor of a smartphone has a minimized power usage, which lowers a driving voltage and reduces a power supply voltage tolerance guaranteeing the operation of the system, and thus deteriorates power noise stability of the system.

In addition, an LSI system having increased processing speed and multifunctionality requires increased operating frequencies and current consumption, which results in an increased frequency with which the voltage fluctuates and increased high frequency components in the power noise, thus making it more difficult to ensure the stability of the system.

Specifically, since the high performance LSI has recently focused on power integrity design, it is necessary to reduce power supply impedance in order to reduce the frequency of voltage fluctuations and the power noise.

The power supply impedance is influenced by the design of the board and the design of the decoupling capacitor, and specifically, the power supply impedance is heavily influenced by the performance of the decoupling capacitor.

Therefore, in order to reduce the power supply impedance, it is necessary to use a low equivalence series inductance (ESL) decoupling capacitor having a low inductance.

While some low-ESL multilayer capacitors have been disclosed, it is expected that impedance will keep decreasing, considering the possibility that LSI systems will have lower voltage and larger current, and therefore, it is necessary for low ESL products to be continuously developed to provide further improved performance.

SUMMARY

An aspect of the present disclosure may provide a multilayer capacitor having low power supply impedance and a board having the same.

According to an aspect of the present disclosure, a multilayer capacitor may include a capacitor body including a first internal electrode and a second internal electrode disposed alternately in a width direction, and further including a dielectric layer interposed therebetween, first and second external electrodes spaced apart from each other on a mounting surface of the capacitor body, and a first insulating layer disposed between the first and second external electrodes on the mounting surface of the capacitor body, in which the first internal electrode includes a first body portion, a first lead portion extending from the first body portion toward the mounting surface of the capacitor body to be electrically connected to the first external electrode, and a second lead portion extending from the first body portion toward a surface of the capacitor body opposite to the mounting surface, the second internal electrode includes a second body portion overlapping the first body portion, a third lead portion partially overlapping the first lead portion and extending from the second body portion toward the mounting surface of the capacitor body to be electrically connected to the second external electrode, and a fourth lead portion extending from the second body portion toward the surface of the capacitor body opposite to the mounting surface, the first and second lead portions extend from the first body portion in a diagonal direction relative to each other, and the third and fourth lead portions extend from the second body portion in a diagonal direction relative to each other.

According to another aspect of the present disclosure, a board of a multilayer capacitor may include a board having first and second electrode pads on an upper side thereof, the multilayer capacitor described above, in which the first and second external electrodes are mounted on the first and second electrode pads, and a solder connecting the first and second external electrodes of the multilayer capacitor to the first and second electrode pads, respectively.

According to another aspect of the present disclosure, a multilayer capacitor may include a capacitor body including a first internal electrode and a second internal electrode disposed alternately in a width direction, and further including a dielectric layer interposed therebetween; first and second external electrodes spaced apart from each other on a mounting surface of the capacitor body; and an insulating layer disposed between the first and second external electrodes on the mounting surface of the capacitor body. The first internal electrode may include a first body portion, a first lead portion extending from the first body portion toward the mounting surface of the capacitor body, and a second lead portion extending from the first body portion toward a first side surface of the capacitor body. The second internal electrode may include a second body portion overlapping the first body portion in the width direction, a third lead portion partially overlapping the first lead portion in the width direction and extending from the second body portion toward the mounting surface of the capacitor body, and a fourth lead portion extending from the second body portion toward a second side surface of the capacitor body opposing the first side surface, in which the first and second side surfaces connect the mounting surface and a surface opposing the mounting surface. The first and second lead portions of the first internal electrode may be electrically connected to the first external electrode, and the third and fourth lead portions of the second internal electrode may be electrically connected to the second external electrode.

BRIEF DESCRIPTION OF DRAWINGS

The above and other aspects, features and other advantages of the present disclosure will be more clearly understood from the following detailed description taken in conjunction with the accompanying drawings, in which:

FIG. 12 is a cross-sectional view of the multilayer capacitor of FIG. 9 mounted on a board.

DETAILED DESCRIPTION

Figure 1:
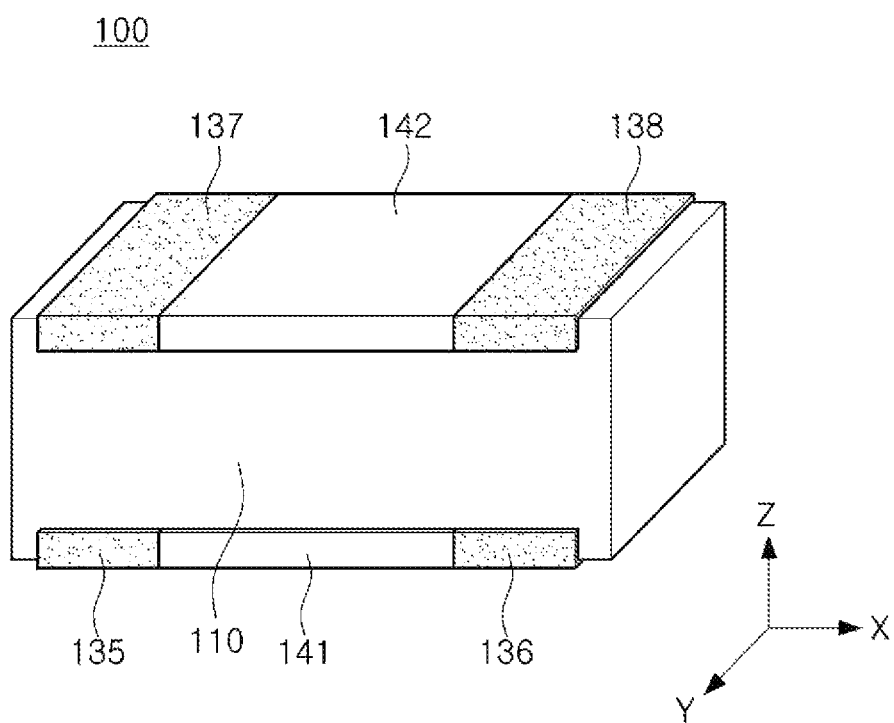
FIG. 1 is a perspective view schematically illustrating a multilayer capacitor according to an exemplary embodiment in the present disclosure.

Hereinafter, exemplary embodiments of the present disclosure will be described in detail with reference to the accompanying drawings.

In order to clearly explain the exemplary embodiments of the present disclosure, the directions of the capacitor body are defined by X, Y and Z in the drawings which denote the length direction, the width direction and the thickness direction of the capacitor body, respectively. As used herein, the 'width direction' may be used in the same sense as the direction in which the dielectric layer and the internal electrodes are stacked.

Further, for convenience of explanation, certain exemplary embodiments will be described below by referring to both opposing surfaces of the capacitor body 110 in the Z direction as first and second surfaces, and referring to both opposing surfaces of the capacitor body 110 in the X direction as third and fourth surfaces, and referring to both opposing surfaces in the Y direction connecting the leading ends of the first and second surfaces to the leading ends of the third and fourth surfaces as fifth and sixth surfaces. The first surface may be used in the same concept as the mounting surface.

Multilayer Capacitor

Figure 2A:
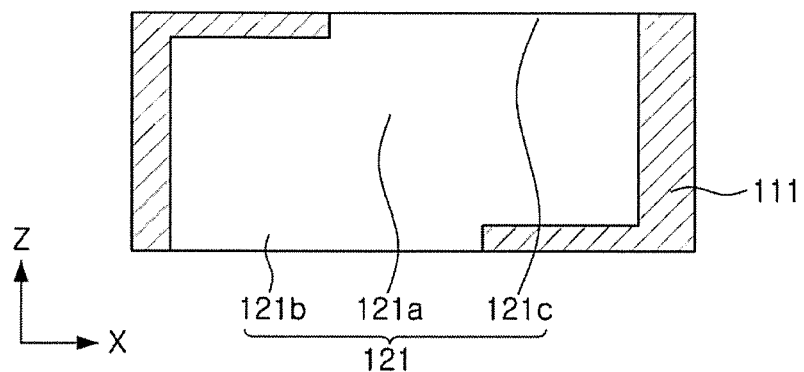
FIGS. 2A and 2B are plan views illustrating first and second internal electrodes of the multilayer capacitor of FIG. 1, respectively.
Figure 2B:
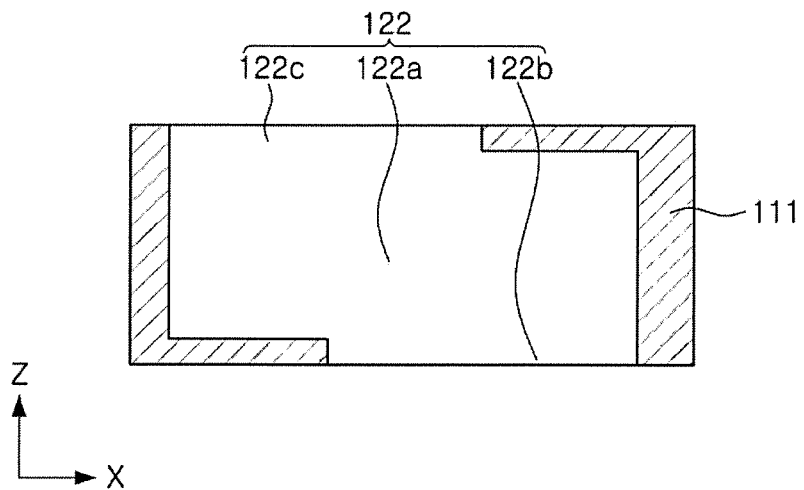
Figure 3:
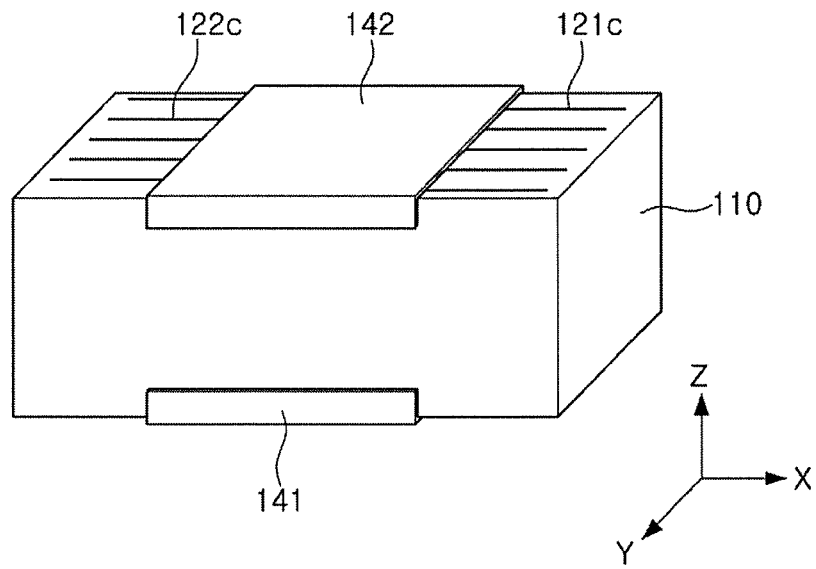
FIG. 3 is a perspective view illustrating the multilayer capacitor of FIG. 1 from which external electrodes are removed.

FIG. 1 is a perspective view schematically illustrating a multilayer capacitor according to an exemplary embodiment in the present disclosure, FIGS. 2A and 2B are plan views illustrating first and second internal electrodes of the multilayer capacitor of FIG. 1, respectively, and FIG. 3 is a perspective view illustrating the multilayer capacitor of FIG. 1 from which external electrodes are removed.

Referring to FIGS. 1 to 3, a multilayer capacitor 100 according to an exemplary embodiment in the present disclosure includes a capacitor body 110 including a dielectric layer 111 and first and second internal electrodes 121 and 122, first and second external electrodes 131 and 132, and a first insulating layer 141.

The capacitor body 110 is formed by laminating a plurality of dielectric layers 111 in the Y direction, and without limitations, may have an approximately hexahedral shape as shown.

In this example, the shapes and dimensions of the capacitor body 110 and the number of dielectric layers 111 being stacked are not limited to those shown in the drawings.

In addition, the dielectric layer 111 is in a sintered state, and the boundaries between adjacent dielectric layers 111 may be integrated to such an extent that it is difficult to discern the boundaries therebetween without using a scanning electron microscope (SEM).

The capacitor body 110 includes an active region including the first and second internal electrodes 121 and 122 that contribute to capacitance generation of the capacitor, and a cover region disposed as a margin region on both end surfaces of the active region in the Y direction.

The active region may be formed by repeatedly laminating a plurality of first and second internal electrodes 121 and 122 in the Y direction, while having the dielectric layers 111 disposed therebetween.

In this example, the thickness of the dielectric layer 111 may be arbitrarily changed according to the capacitance design of the multilayer capacitor 100.

In addition, the dielectric layer 111 may include ceramic powder having a high dielectric constant, such as barium titanate ($BaTiO_3$)-based or strontium titanate ($SrTiO_3$)-based powder, but is not limited thereto.

In addition, one or more of several ceramic additives, an organic solvent, a plasticizer, a binder and a dispersant may be added to the dielectric layer 111 together with the ceramic powder as need arises.

The cover region is located on both end surfaces of the active region in the Y direction, respectively, and may have the same material and configuration as the dielectric layer 111 except that it does not include internal electrodes.

The cover region may be formed by laminating a single dielectric layer or two or more dielectric layers 111 on both end surfaces of the active region in the Y direction, and may basically serve to prevent damages to the first and second internal electrodes 121 and 122 from physical or chemical stresses.

The first and second internal electrodes 121 and 122 may be spaced apart from both side surfaces of the capacitor body 110 in the X direction.

The first and second external electrodes 131 and 132 are disposed on the first surface of the capacitor body 110 while being spaced apart from each other in the X direction.

In this example, the first and second external electrodes 131 and 132 may extend to a portion of the fifth and sixth surfaces of the capacitor body 110, respectively, which may subsequently enhance the fixing strength of the first and second external electrodes 131 and 132.

The first and second external electrodes 131 and 132 may be formed of a conductive paste containing a conductive metal.

The conductive metal may be, for example, nickel (Ni), copper (Cu), palladium (Pd), gold (Au), or an alloy thereof, but is not limited thereto.

Further, plating layers 135 and 136 may be further formed on surfaces of the first and second external electrodes 131 and 132, respectively, if necessary.

The plating layers 135 and 136 may include a nickel (Ni) plating layer and a tin (Sn) plating layer, but is not limited thereto.

The plating layers 135 and 136 are provided to further increase the adhesive strength between the multilayer capacitor 100 and a board or the like when the multilayer capacitor 100 is mounted on the board or the like with solder.

The first and second internal electrodes 121 and 122 have different polarities from each other.

The first and second internal electrodes 121 and 122 are disposed in turn in the capacitor body 110 in the Y direction, while having the dielectric layers 111 disposed therebetween.

Further, the first and second internal electrodes 121 and 122 may be formed by printing a conductive paste containing a conductive metal to a predetermined thickness on the dielectric layer 111, and may be electrically insulated from each other by the dielectric layer 111 disposed therebetween.

The conductive metal included in the conductive paste may be nickel (Ni), copper (Cu), palladium (Pd), or alloys thereof for example, although not limited thereto.

The conductive paste may be printed by screen printing or gravure printing, although not limited thereto.

The first and second internal electrodes 121 and 122 of the exemplary embodiment are exposed through the first surface 1, the mounting surface of the capacitor body 110.

The first and second internal electrodes 121 and 122 may be spaced apart from the third and fourth surfaces in the longitudinal direction of the capacitor body 110 to ensure reliability.

In this example, the area of the first and second internal electrodes 121 and 122 overlapping each other in the Y direction is associated with the capacitance generation of the capacitor.

In the exemplary embodiment, the first internal electrode 121 may include a first body portion 121a, a first lead portion 121b, and a second lead portion 121c.

The first lead portion 121b extends from the first body portion 121a toward the first surface, the mounting surface of the capacitor body 110, and is exposed through the first surface of the capacitor body 110, to be coupled and electrically connected to the first external electrode 131.

The second lead portion 121c extends from the first body portion 121a toward the second surface of the capacitor body 110 opposite to the mounting surface and is exposed through the second surface of the capacitor body 110.

The first lead portion 121b and the second lead portion 121c may extend from the first body portion 121a, respectively, in such a manner that a direction in which the first lead portion 121b is exposed to the mounting surface of the capacitor body 110 and a direction in which the second lead portion 121c is exposed to the surface of the capacitor body 110 opposite to the mounting surface are diagonal to each other.

The second internal electrode 122 includes a second body portion 122a overlapping the first body portion 121a in the Y direction, a third lead portion 122b, and a fourth lead portion 122c.

The third lead portion 122b partially overlaps the first lead portion 121b in the Y direction and extends from the second body portion 122a toward the first surface, the mounting surface of the capacitor body 110, and exposed through the first surface of the capacitor body 110, to be coupled and electrically connected to the second external electrode 131.

The fourth lead portion 122c partially overlaps the second lead portion 121c in the Y direction and extends from the second body portion 122a through the second surface of the capacitor body opposite to the mounting surface 110, and exposed through the second surface of the capacitor body 110.

The third lead portion 122b and the fourth lead portion 122c extend from the second body portion 122a, respectively, in such a manner that a direction in which the third lead portion 122b is exposed to the mounting surface of the capacitor body 110 and a direction in which the fourth lead portion 122c is exposed to the surface of the capacitor body 110 opposite to the mounting surface are diagonal to each other.

The first insulating layer 141 is disposed on the first surface of the capacitor body 110 and between the first and second external electrodes 131 and 132.

The first insulating layer 141 on the first surface of the capacitor body 110 serves to cover an overlapping portion between the first and third lead portions 121b and 122b that is exposed through the first surface of the capacitor body 110.

Meanwhile, in the exemplary embodiment, a portion of the second lead portion 121c of the first internal electrode 121 may be formed to overlap with a portion of the fourth lead portion 122c of the second internal electrode 122 in the Y direction.

Third and fourth external electrodes 133 and 134 may be formed and spaced apart from each other in the X direction, on the second surface that is the surface of the capacitor body 110 opposite to the mounting surface.

In this example, the third and fourth external electrodes 133 and 134 may extend to a portion of the fifth and sixth surfaces of the capacitor body 110, respectively, which may subsequently enhance the fixing strength of the third and fourth external electrodes 133 and 134.

The third and fourth external electrodes 133 and 134 may be formed of a conductive paste containing a conductive metal.

The conductive metal may be, for example, copper (Cu), silver (Ag), or alloys thereof, but is not limited thereto.

Further, plating layers 137 and 138 may be further formed on surfaces of the third and fourth external electrodes 133 and 134, respectively, if necessary. The plating layers 137 and 138 may include a nickel (Ni) plating layer and a tin (Sn) plating layer.

The second and fourth lead portions 121c and 122c may be connected to the third and fourth external electrodes 133 and 134, respectively.

A second insulating layer 142 may be formed on the second surface, a surface of the capacitor body opposing the mounting surface 110, and between the third and fourth external electrodes 133 and 134.

The second insulating layer 142 serves to cover an overlapping portion between the second and fourth lead portions 121c and 122c on the first surface of the capacitor body 110 that is exposed through the second surface of the capacitor body 110.

The multilayer capacitor 100 according to the exemplary embodiment has a lower-side mounting structure in which the first surface is the mounting surface of the capacitor body 110, and both the first and third lead portions 121b and 122b are exposed to the first surface that is the mounting surface of the capacitor body 110, which may shorten the current path when a voltage is applied, thereby reducing the inductance (ESL) of the multilayer capacitor 100.

According to the exemplary embodiments, portions of the lead portions exposed through the same surface of the capacitor body 110 are overlapped with each other, thereby ensuring a greater overlapping area between the first and second internal electrodes 121 and 122, which may further increase the capacitance of the multilayer capacitor 100 and reduce the ESL compared to the related multilayer capacitor, and further reduce ESL by reducing an area of the current loop of the multilayer capacitor 100.

When the interval between the first and second external electrodes 131 and 132 decreases as in the exemplary embodiment described above, when mounted on the board, the mounting defect or the current leakage of the solder bridge increases, and defects may occur during manufacture due to exposure of the internal electrodes. However, since the insulating layer is formed in the exemplary embodiment to cover the overlapping portions of the lead portions exposed through the same surface of the capacitor body 110, it prevents a mounting defect or current leakage of the solder bridge or the like, and thus enhances the reliability of the multilayer capacitor 100.

Figure 9:
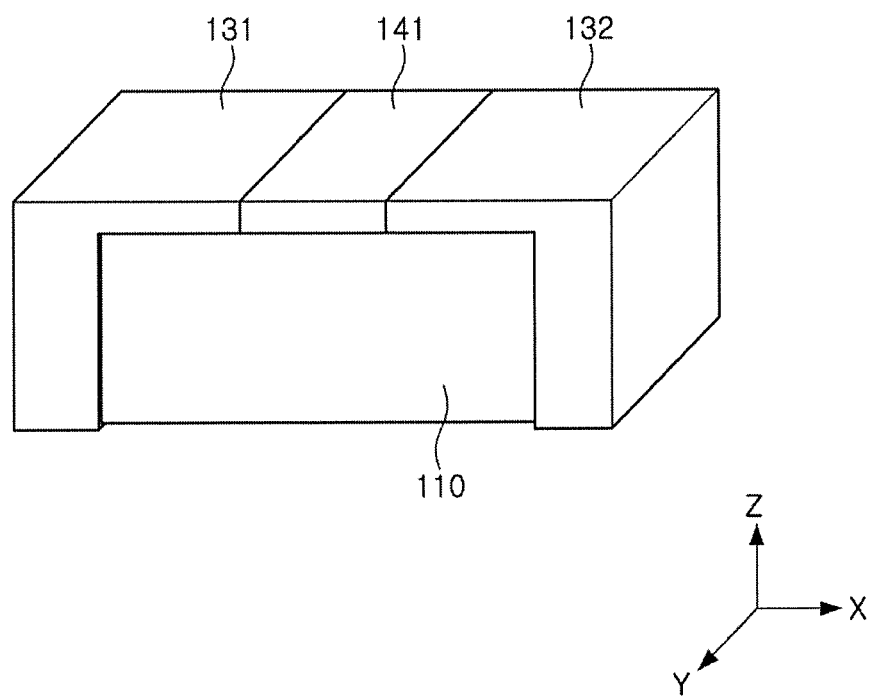
FIG. 9 is a perspective view schematically illustrating a multilayer capacitor according to another exemplary embodiment in the present disclosure.
Figure 10:
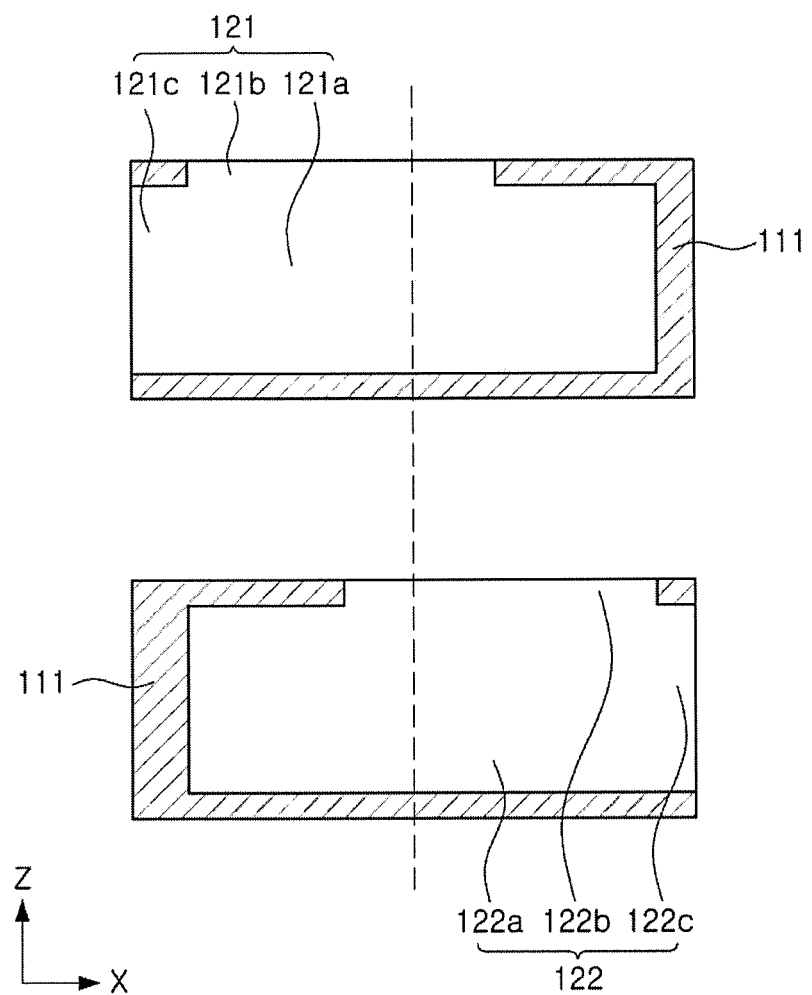
FIG. 10 is a plan view illustrating each of first and second internal electrodes of the multilayer capacitor of FIG. 9.
Figure 11:
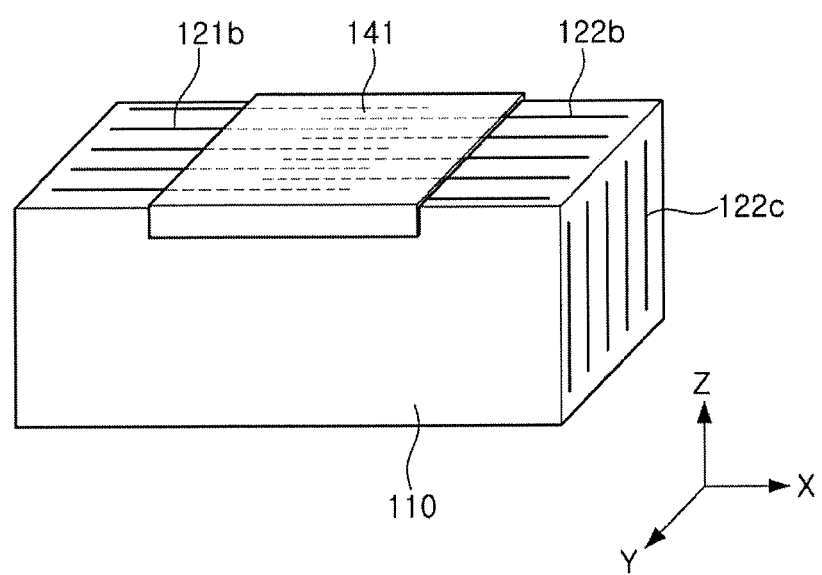
FIG. 11 is a perspective view illustrating the multilayer capacitor of FIG. 9 from which external electrodes are removed.

Referring to FIGS. 9 to 11, a multilayer capacitor 100''' according to an exemplary embodiment in the present disclosure includes a capacitor body 110 including a dielectric layer 111 and first and second internal electrodes 121 and 122, first and second external electrodes 131 and 132, and an insulating layer 141.

The multilayer capacitor 100''' may further include first and second external electrodes 131 and 132 spaced apart from each other on a mounting surface of the capacitor body 110.

The insulating layer 141 may be disposed between the first and second external electrodes 131 and 132 on the mounting surface of the capacitor body 110.

The first internal electrode 121 may include a first body portion 121*a*, a first lead portion 121*b* extending from the first body portion 121*a* toward the mounting surface of the capacitor body 110, and a second lead portion 121*c* extending from the first body portion 121*a* toward a first side surface of the capacitor body 110 in the X-direction.

The second internal electrode 122 may include a second body portion 122*a* overlapping the first body portion 121*a* in the width direction, a third lead portion 122*b* partially overlapping the first lead portion 121*b* in the width direction and extending from the second body portion 122*a* toward the mounting surface of the capacitor body 110, and a fourth lead portion 122*c* extending from the second body portion 122*a* toward a second side surface of the capacitor body 110 opposing the first side surface in the X-direction. The first and second side surfaces connect the mounting surface and a surface opposing the mounting surface.

The first and second lead portions 121*b* and 121*c* of the first internal electrode 121 may be electrically connected to the first external electrode 131, and the third and fourth lead portions 122*b* and 122*c* of the second internal electrode 122 may be electrically connected to the second external electrode 132.

Exposed portions of the first and second lead portions 121*b* and 121*c* may be entirely covered by the first external electrode 131, and exposed portions of the third and fourth lead portions 122*b* and 122*c* may be entirely covered by the second external electrode 132.

MODIFIED EXAMPLE

Figure 4:
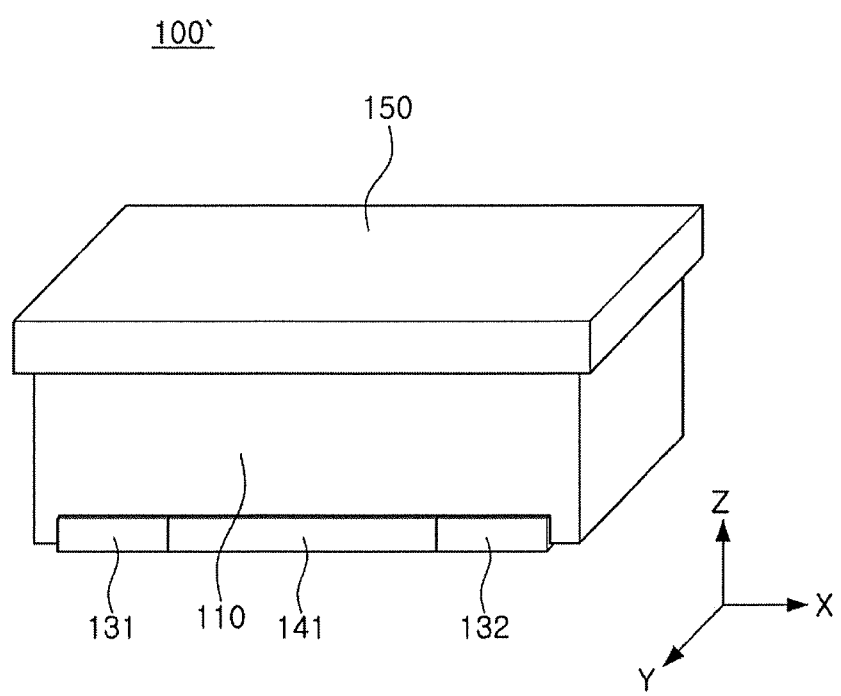
FIG. 4 is a perspective view schematically illustrating a multilayer capacitor according to another exemplary embodiment in the present disclosure.

Referring to FIG. 4, the multilayer capacitor 100' according to an exemplary embodiment may further include an insulating portion 150 disposed on a second surface that is a surface of the capacitor body 110 opposing the mounting surface.

That is, in the structure according to the exemplary embodiment, an external electrode is formed only on a first surface that is the mounting surface of the capacitor body 110, and an internal electrode exposed on a second surface of the capacitor body 110 is covered entirely by the insulating portion 150, which may prevent penetration of the plating solution during the plating process and thus improve reliability.

In the example described above, the insulating portion 150 may be formed of an insulator such as epoxy, or the like, although not limited thereto.

Accordingly, when the multilayer capacitor 100' is mounted on a board, the height at which a solder fillet is formed may be adjusted.

Accordingly, transmission of the piezoelectric vibrations of the capacitor body 110 to the board through the solder may be blocked, which may thus reduce the acoustic noise and improve the ESL and reliability of the multilayer capacitor 100'.

Figure 5:
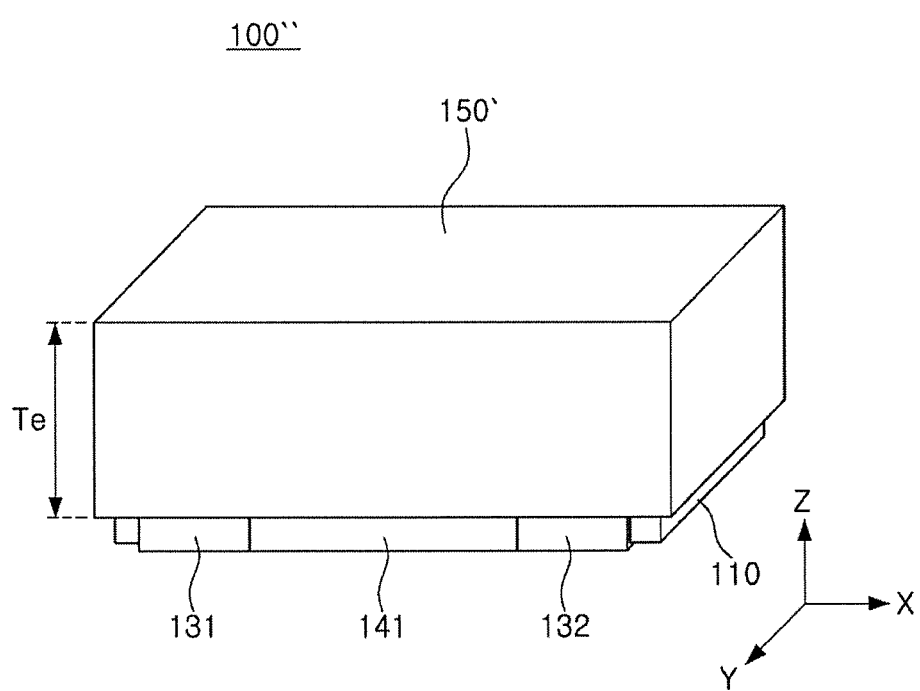
FIG. 5 is a perspective view schematically illustrating a multilayer capacitor according to another exemplary embodiment in the present disclosure.

Meanwhile, as shown in FIG. 5, an insulating portion 150' may be formed with an increased height Te such that a lower end of the insulating portion 150' may be adjacent to first and second external electrodes 131 and 132 or may touch upper ends of the external electrodes 131 and 132.

Accordingly, when the multilayer capacitor 100'' is mounted on a circuit board, the insulating portion 150' formed as described above may prevent ingress of moisture or the like into the multilayer capacitor 100 through peripheral surfaces of the capacitor body 110, thereby further improving the reliability.

Mounting Board of Multilayer Capacitor

Figure 6:
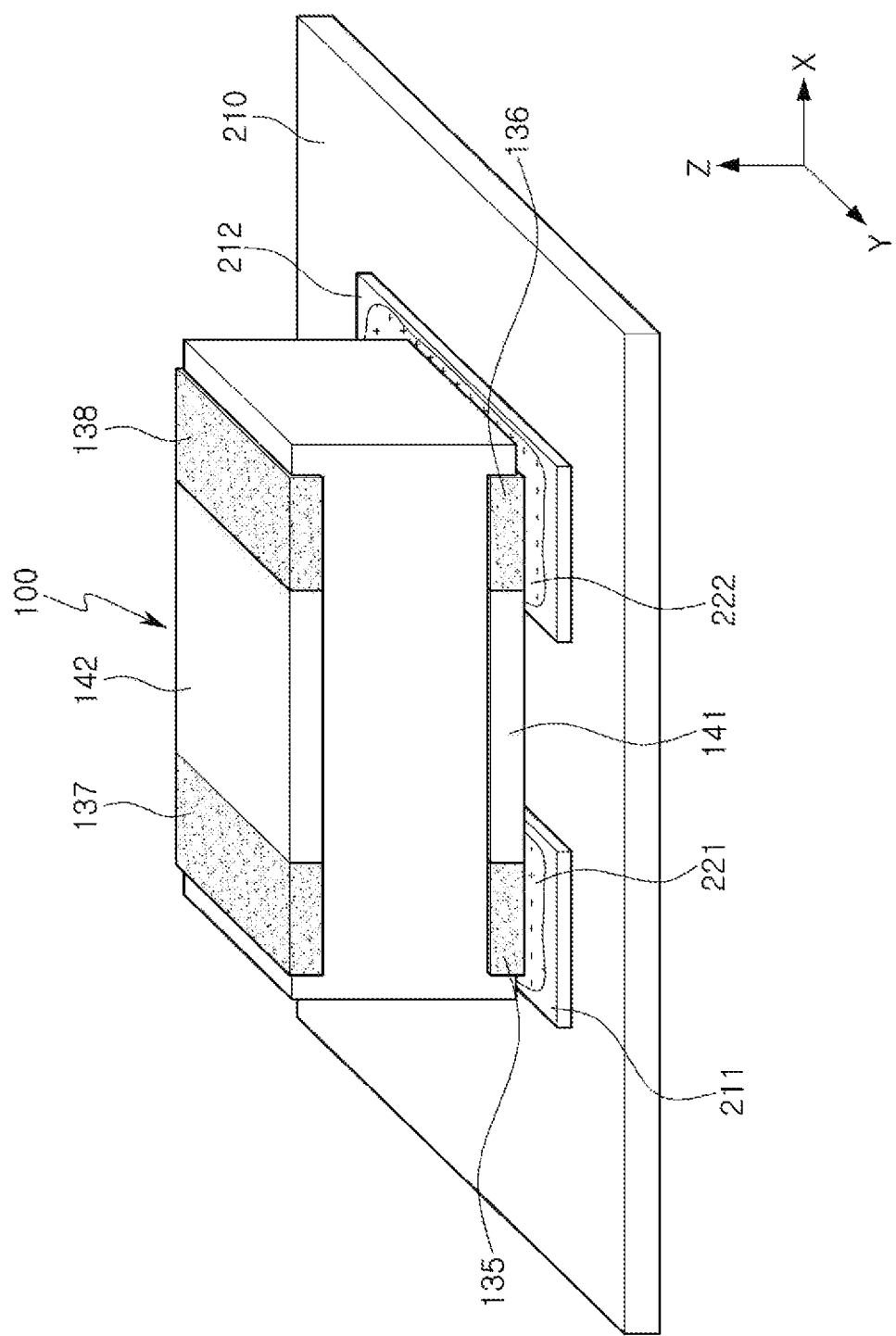
FIG. 6 is a cross-sectional view of the multilayer capacitor of FIG. 1 mounted on a board.

Referring to FIG. 6, a mounting board of a multilayer capacitor according to an exemplary embodiment includes a board 210 on which a multilayer capacitor 100 is mounted, and first and second electrode pads 211 and 212 disposed and spaced apart from each other on an upper surface of the board 210.

The multilayer capacitor 100 may be coupled and electrically connected to the board 210 by placing the first and second external electrodes 131 and 132 on the first and second electrode pads 211 and 212 in contact and then securing the same with solders 221 and 222.

Referring to FIG. 12, a mounting board of a multilayer capacitor according to another exemplary embodiment includes a board 210 on which a multilayer capacitor 100''' is mounted, and first and second electrode pads 211 and 212 disposed and spaced apart from each other on an upper surface of the board 210.

Figure 7:
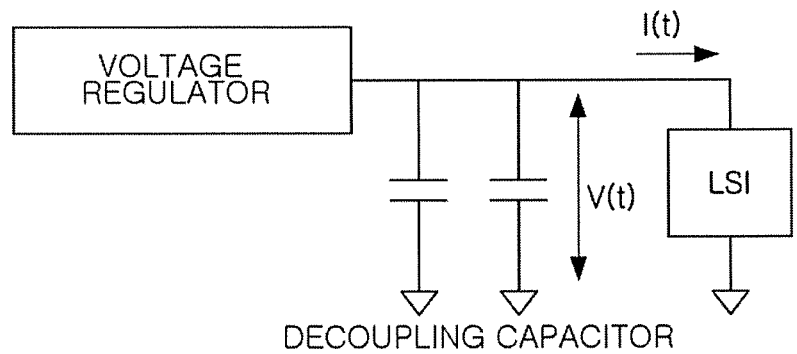
FIG. 7 is a circuit diagram schematically illustrating an example in which a multilayer capacitor according to an exemplary embodiment in the present disclosure is used as a decoupling capacitor of an LSI power supply circuit.
Figure 8:
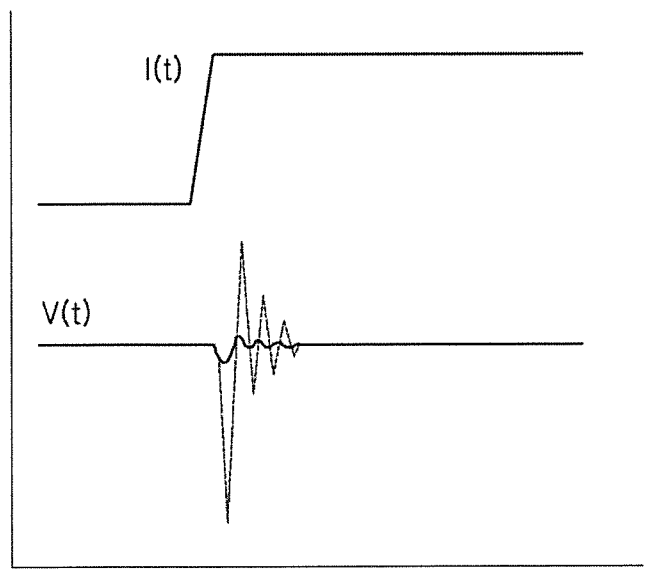
FIG. 8 is a graph illustrating variations in current and voltage in the circuit of FIG. 7.

FIG. 7 is a circuit diagram schematically illustrating an exemplary embodiment in which a multilayer capacitor of the present disclosure is used as a decoupling capacitor of an LSI power supply circuit, and FIG. 8 is a graph illustrating change in current I(t) and variation in voltage V(t).

The LSI power supply generates sudden and large current changes. Therefore, in order to stabilize the operation while keeping the voltage of the LSI power supply within the acceptable range, it is necessary to design the power supply impedance to be small and in a wide frequency band.

Referring to FIGS. 7 and 8, a plurality of decoupling capacitors disposed between a voltage regulator and an LSI serve to absorb sudden and large changes in the current flowing through the LSI and also to absorb variations in voltage caused by the wiring inductance, thereby stabilizing the power supply voltage. In this example, there is a possibility that anti-resonance may be caused between each capacitor, increasing impedance.

When a multilayer capacitor according to the present disclosure is applied to a decoupling capacitor used in an LSI power circuit, the current path may be reduced by a terminal electrode formed on the surface of the capacitor body opposing the mounting surface.

Therefore, the power supply impedance may be greatly reduced by absorbing the changes of the current and the variations in voltage caused by the wiring inductance so that the stability of the system against the power noise of the LSI may be greatly improved.

Further, the exemplary embodiments provide a lower-side mounting structure for the multilayer capacitor and thus can effectively save a space for mounting the multilayer capacitor, advantageous when considering recent trend toward higher-performance portable phones such as smart phones which have continuously limited space for mounting a decoupling capacitor on a board.

As set forth above, according to the exemplary embodiment in the present disclosure, there is an effect that the ESL of a multilayer capacitor may be lowered.

While exemplary embodiments have been shown and described above, it will be apparent to those skilled in the art that modifications and variations could be made without departing rom the scope of the present invention as defined by the appended claims.

What is claimed is:

1. A multilayer capacitor, comprising:
a capacitor body including a first internal electrode and a second internal electrode disposed alternately in a width direction, and further including a dielectric layer interposed therebetween;
first and second external electrodes spaced apart from each other on a mounting surface of the capacitor body; and
a first insulating layer disposed between the first and second external electrodes on the mounting surface of the capacitor body,
wherein the first internal electrode includes a first body portion, a first lead portion extending from the first body portion toward the mounting surface of the capacitor body to be electrically connected to the first external electrode, and a second lead portion extending from the first body portion toward a surface of the capacitor body opposing the mounting surface,
the second internal electrode includes a second body portion overlapping the first body portion in the width direction, a third lead portion partially overlapping the first lead portion in the width direction and extending from the second body portion toward the mounting surface of the capacitor body to be electrically connected to the second external electrode, and a fourth lead portion extending from the second body portion toward the surface of the capacitor body opposing the mounting surface, and
the first and second lead portions extend from the first body portion in a first diagonal direction opposite to each other with respect to a center of the first body portion, and the third and fourth lead portions extend from the second body portion in a second diagonal direction opposite to each other with respect to a center of the second body portion.

2. The multilayer capacitor of claim 1, wherein the first insulating layer covers an overlapped portion of the first and third lead portions.

3. The multilayer capacitor of claim 1, wherein the first and second internal electrodes are spaced apart from both end surfaces of the capacitor body in the width direction.

4. The multilayer capacitor of claim 3, wherein the first and second internal electrodes are further spaced apart from both side surfaces of the capacitor body, which connects the end surfaces of the capacitor body opposing each other and connects the mounting surface of the capacitor body and the surface opposing the mounting surface.

5. The multilayer capacitor of claim 1, wherein a portion of the second lead portion and a portion of the fourth lead portion overlap each other in the width direction,
and the multilayer capacitor further comprises:
third and fourth external electrodes spaced apart from each other on the surface of the capacitor body opposing the mounting surface, the third and fourth external electrodes being electrically connected to the second and fourth lead portions, respectively; and
a second insulating layer disposed to cover an overlapped portion of the second lead portion and the fourth lead portion on the surface of the capacitor body opposing the mounting surface.

6. The multilayer capacitor of claim 1, further comprising an insulating portion disposed on the surface of the capacitor body opposing the mounting surface.

7. The multilayer capacitor of claim 6, wherein the second and fourth lead portions are entirely covered by the insulating portion.

8. The multilayer capacitor of claim 6, wherein the insulating portion further extends toward the mounting surface, and
a lower end of the insulating portion is adjacent to the first and second external electrodes disposed on the mounting surface or in contact with upper ends of the first and second external electrodes.

9. The multilayer capacitor of claim 1, wherein the first and second external electrodes each include a plating layer disposed thereon.

10. A board of a multilayer capacitor, comprising:
a board including first and second electrode pads on an upper side thereof;
the multilayer capacitor of claim 1 wherein the first and second external electrodes are mounted on the first and second electrode pads; and
a solder connecting the first and second external electrodes of the multilayer capacitor to the first and second electrode pads, respectively.

11. The multilayer capacitor of claim 1, wherein a pair of first space portions are defined by the first body portion and the first and second lead portions, the pair of first space portions arranged in a third diagonal direction, and
a pair of second space portions are defined by the second body portion and the third and fourth lead portions, the pair of second space portions arranged in a fourth diagonal direction crossing the third diagonal direction.

12. A multilayer capacitor, comprising:
a capacitor body including a first internal electrode and a second internal electrode disposed alternately in a width direction, and further including a dielectric layer interposed therebetween;
first and second external electrodes spaced apart from each other on a mounting surface of the capacitor body; and
an insulating layer disposed between the first and second external electrodes on the mounting surface of the capacitor body,
wherein the first internal electrode includes a first body portion, a first lead portion extending from the first body portion toward the mounting surface of the capacitor body, and a second lead portion extending from the first body portion toward a first side surface of the capacitor body and exposed from the first side surface, the second internal electrode includes a second body portion overlapping the first body portion in the width direction, a third lead portion partially overlapping the first lead portion in the width direction and extending from the second body portion toward the mounting surface of the capacitor body, and a fourth lead portion extending from the second body portion toward a second side surface of the capacitor body opposing the first side surface and exposed from the second side surface, in which the first and second side surfaces connect the mounting surface and a surface opposing the mounting surface, the first and second lead portions of the first internal electrode are electrically connected to the first external electrode, and the third and fourth lead portions of the second internal electrode are electrically connected to the second external electrode.

13. The multilayer capacitor of claim 12, wherein the insulating layer covers an overlapped portion of the first and third lead portions.

14. The multilayer capacitor of claim 13, wherein exposed portions of the first and second lead portions are entirely covered by the first external electrode, and exposed portions of the third and fourth lead portions are entirely covered by the second external electrode.

15. The multilayer capacitor of claim 12, wherein the first and second internal electrodes are spaced apart from both end surfaces of the capacitor body in the width direction.

16. The multilayer capacitor of claim 12, wherein the first and second external electrodes each include a plating layer disposed thereon.

17. A board of a multilayer capacitor, comprising:
a board including first and second electrode pads on an upper side thereof;
the multilayer capacitor of claim 12 wherein portions of the first and second external electrodes are mounted on the first and second electrode pads; and
a solder connecting the first and second external electrodes of the multilayer capacitor to the first and second electrode pads, respectively.

* * * * *